(12) United States Patent
Romero

(10) Patent No.: US 10,794,936 B2
(45) Date of Patent: Oct. 6, 2020

(54) MAGNETIC FIELD SENSOR PROVIDING CONSTANT VOLTAGE ACROSS MAGNETORESISTANCE ELEMENTS

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 165 days.

(21) Appl. No.: 16/139,742

(22) Filed: Sep. 24, 2018

(65) Prior Publication Data

US 2020/0096543 A1 Mar. 26, 2020

(51) Int. Cl.
*G01R 15/20* (2006.01)
*G01R 15/14* (2006.01)
*G01R 33/09* (2006.01)
*G01R 33/00* (2006.01)
*G01R 33/07* (2006.01)

(52) U.S. Cl.
CPC ......... *G01R 15/205* (2013.01); *G01R 15/144* (2013.01); *G01R 33/0041* (2013.01); *G01R 33/09* (2013.01); *G01R 33/007* (2013.01); *G01R 33/07* (2013.01)

(58) Field of Classification Search
CPC .... G01R 15/144; G01R 15/205; G01R 15/14; G01R 33/09
See application file for complete search history.

(56) References Cited

U.S. PATENT DOCUMENTS

| | | | | |
|---|---|---|---|---|
| 4,833,406 A | * | 5/1989 | Foster | G01D 3/032 324/225 |
| 4,908,527 A | * | 3/1990 | Van Antwerp | G05F 3/225 257/423 |
| 9,720,054 B2 | | 8/2017 | Drouin et al. | |
| 2008/0084205 A1 | * | 4/2008 | Zimmer | G01K 7/22 324/252 |
| 2013/0214774 A1 | * | 8/2013 | Cesaretti | G01R 33/0041 324/251 |
| 2017/0285117 A1 | | 10/2017 | Drouin et al. | |

* cited by examiner

*Primary Examiner* — Christopher E Mahoney
(74) *Attorney, Agent, or Firm* — Daly, Crowley, Mofford & Durkee, LLP

(57) ABSTRACT

A magnetic field sensor comprises a magnetoresistance element with a variable conductivity that changes based on a function of a magnetic field strength and angle of an external magnetic field and a voltage across the magnetoresistance element. A circuit is included to monitor an electrical current through the magnetoresistance element during operation and to apply a constant voltage across the magnetoresistance element based on the monitored electrical current so that the variable conductivity does not change as result of a changing voltage across the magnetoresistance element.

28 Claims, 4 Drawing Sheets

MAGNETIC FIELD SENSOR PROVIDING CONSTANT VOLTAGE ACROSS MAGNETORESISTANCE ELEMENTS

FIELD

This disclosure relates to magnetic field sensors and, more particularly, to magnetic field sensors having magnetoresistance elements with output signals that are a function of a voltage across the magnetoresistance elements.

BACKGROUND

Magnetoresistance elements are used in many magnetic field sensors to detect a magnetic field. Generally, these elements act as resistors with a variable resistance that changes in response to an external magnetic field. However, although resistance and conductivity are related, it is the conductivity of the magnetoresistance element that changes linearly in response to the external magnetic field's angle. Also, the conductivity may change as a function of the voltage across the magnetoresistance element.

In a typical bridge circuit, four magnetoresistance elements are arranged in a bridge configuration between a power terminal and a ground terminal. In this configuration, in response to changes in the external magnetic field, the voltage across the magnetoresistance elements changes—producing a voltage signal representing the external magnetic field. Because the conductivity of the magnetoresistance elements changes in response to the voltage across the magnetoresistance elements, the magnetoresistance elements themselves can introduce errors or non-linearities in output signal. In this case, the voltage across each MR element in the bridge arrangement will also be a function of the sensed magnetic field.

SUMMARY

A magnetic field sensor circuit that monitors current through magnetoresistance elements and, in response to the monitored current, provides a constant voltage across the magnetoresistance elements may reduce errors in the output signal of the magnetic field sensor.

In an embedment, a magnetic field sensor comprises a magnetoresistance element with a variable conductivity that changes based on a function of a magnetic field strength and angle of an external magnetic field and a voltage across the magnetoresistance element. A circuit is included to monitor an electrical current through the magnetoresistance element during operation and to apply a constant voltage across the magnetoresistance element based on the monitored electrical current so that the variable conductivity does not change as result of a changing voltage across the magnetoresistance element.

One or more of the following features may be included.

The circuit may comprise a variable voltage source coupled in series with the magnetoresistance element.

The variable voltage source may comprise a transistor.

The variable voltage source may further comprise an operational amplifier having an output coupled to a base or gate terminal of the transistor.

The transistor may be a bipolar junction transistor.

A plurality of magnetoresistance elements arranged in a bridge circuit configuration may be included, each having a variable conductivity that changes based on a function of the magnetic field strength and angle of the external magnetic field and a voltage across the respective magnetoresistive element.

The circuit may monitor an electrical current through each of the plurality of magnetoresistance elements.

The circuit may comprise a plurality of variable voltage sources each coupled in series with one of the plurality of magnetoresistance elements.

Each of the plurality of variable voltage sources may comprise a transistor.

The transistor may be a bipolar junction transistor.

Each of the plurality of variable voltage sources may further comprise an operational amplifier having an output coupled to a base or gate terminal of a respective transistor.

The circuit may comprise a differential operational amplifier having a negative input coupled to a first output terminal of the bridge circuit and a positive input coupled to a second output terminal of the bridge circuit.

A first feedback loop may be coupled from a positive output terminal of the operational amplifier to the negative input terminal of the operation amplifier and a second feedback loop may be coupled from a negative output terminal of the operational amplifier to the positive input of the operational amplifier.

The first and second feedback loops may each comprise a resistor coupled in series with the feedback loop.

A second differential operational amplifier may be included, wherein a positive output terminal and a negative terminal of the second differential amplifier are coupled to the bridge circuit.

The positive output terminal of the second differential amplifier may be coupled to a power side of the bridge circuit and the negative terminal of the second differential amplifier is coupled to a ground side of the bridge circuit so that the second differential amplifier provides power to the bridge circuit.

The magnet field sensor may also include a first output terminal of the bridge circuit, a second output terminal of the bridge circuit, and a demodulator circuit. The first and second output terminals of the bridge circuit are coupled to the demodulator.

The first and second output terminals of the bridge circuit may be AC-coupled to the demodulator circuit.

A differential operational amplifier may be included, wherein an output of the demodulator is coupled to an input terminal of the differential operational amplifier.

The demodulator circuit may be a chopper circuit.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
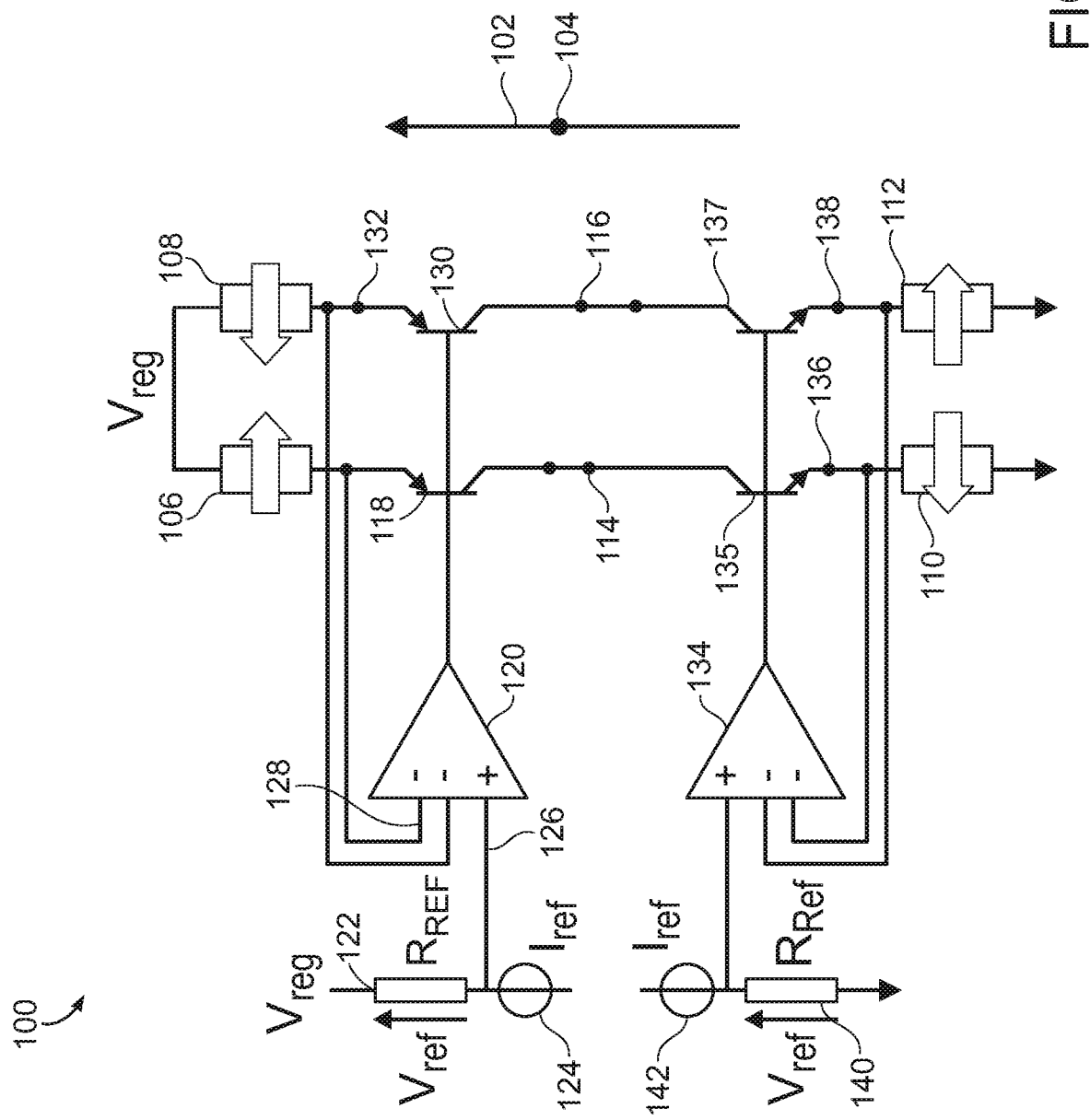
FIG. 1 is a circuit diagram of a magnetic field sensor.

FIG. 1 is a circuit diagram of a magnetic field sensor circuit 100 for detecting the angle of a rotating magnetic field. Magnetic field 102 (represented in FIG. 1 by a vector) may be a magnetic field produced by a rotating target. Magnetic field 102 may rotate about an axis 104. Magnetic field sensor circuit 100 may be positioned to detect the magnetic field and calculate its current angle of rotation. Magnetic field 102 is shown to the right of magnetic field sensor circuit 100 for ease of illustration. In embodiments, magnetic field sensor circuit 100 may be positioned so that magnetoresistance elements 106-112 form a rectangle (or other geometrical shape) that is centered about axis 104.

Circuit 100 may include a plurality of magnetic field sensing, which may comprise magnetoresistance elements 106, 108, 110, and 112 configured to detect magnetic field 102. Magnetoresistance elements 106-112 may be coupled together to form a bridge circuit with a first node 114 and a node 116. The output signal of the bridge circuit may be a differential voltage signal between nodes 114 and 116.

Magnetoresistance elements 106-112 may be positioned symmetrically in order to detect magnetic field 102. For example, they may be positioned in a rectangle or other regular shape. In embodiments, magnetoresistance elements 106-112 may also be oriented to detect the rotational angle of magnetic field 102. For example, each magnetoresistance element 106-112 has an axis of maximum sensitivity represented by an arrow in FIG. 1. In the example shown, magnetoresistance elements 106 and 112 may be oriented so their axes of maximum sensitivity are aligned to the right and magnetoresistance elements 108 and 110 may be oriented so their axes of maximum sensitivity is aligned to the left. These orientations may result in magnetic field sensor circuit 100 producing a differential output (e.g. a voltage differential between nodes 114 and 116) that represents, or can be used to calculate, an angle of rotation of magnetic field 102.

Magnetoresistance elements 106-112 may be magnetoresistance elements. As such, each magnetoresistance element 106-112 may have an electrical conductivity that varies in response the external magnetic field 102. For example, if magnetic field 102 is aligned with the axis of maximum sensitivity of magnetoresistance element 106, then the conductivity of magnetoresistance element 106 may be minimized. In other embodiments, the conductivity of magnetoresistance element 106 may be maximized or may be at a middle range if magnetic field 102 is aligned with the axis of maximum sensitivity, depending on the configuration of magnetoresistance element. The conductance of a magnetoresistance element in response to an external magnetic field may be generalized as:

$$G(\theta) = G_\perp(1 + MR_{avg} \cos(\theta)) \quad (1)$$

where MRavg is the average magnetoresistance variation over a delta and θ represents the rotational angle of the external magnetic field.

The resistance of magnetoresistance elements 106-112 may also change in response to other stimuli. For example, temperature and other external factors may affect the conductivity of magnetoresistance elements 106-112. In particular, the voltage across each magnetoresistance element 106-112 may affect the conductivity of the respective magnetoresistance element. Since the conductivity changes in response to the external magnetic field that is being detected, the resulting change in voltage across the magnetoresistance element can cause errors in the conductivity, and thus cause errors in the magnetoresistance element's output.

For example, $G_\perp$ and MRavg variable in equation (1) may be generalized by the following equations:

$$G_\perp = \frac{Gmin - Gmax}{2} \quad (2)$$

$$MR_{avg} = \frac{Gmax - Gmin}{Gmax + Gmin} \quad (3)$$

Where:

$$Gmin = Gmin(V) = Gmin(V = 0V)\left(1 + \frac{V}{V_H}\right)^2 \quad (4)$$

$V_H$ is a constant. As illustrated in the equations above, the conductance G (and thus the conductivity) of a magnetoresistance element depends on the voltage V across the magnetoresistance element.

To compensate for errors caused by the change in voltage across magnetoresistance elements 106-112, circuit 100 may include one or more circuits to monitor the current through magnetoresistance elements 106-112 and, in response to the monitored current, provide a constant voltage across magnetoresistance elements 106-112.

For example, in embodiments, circuit 100 includes a current monitoring circuit comprising BJT transistor 118 and operational amplifier (op-amp) 120. The current monitoring circuit may also include a voltage reference 122 and current reference 124 coupled to the positive input terminal of op-amp 120. The output of op-amp 120 may be coupled to the base terminal of BJT 118 so that op-amp 120 may drive BJT 118. Op-amp 120 will operate to keep the voltage between positive input terminal 126 and negative input terminal 128 at zero volts. Thus, as the voltage across magnetoresistance element 106 attempts to change, operational amplifier 120 will drive BJT transistor 118 so that the voltage across magnetoresistance element 106 does not change, thus keeping the voltage across magnetoresistance element 106 constant. In this configuration, BJT 118 may act as a variable current source controlled by op-amp 120. The feedback loop from the bottom side of magnetoresistance element 106 to the negative input terminal 128 of op-amp 120 ensures that BJT 118 draws the proper amount of current so that the voltage across magnetoresistance element 106 remains constant (i.e. remains equal to the reference voltage at input terminal 126).

Magnetic field sensor circuit 100 may also include additional circuits to sense the current through each magnetoresistance element 108-112 and, in response to the sensed current, apply a constant voltage across the magnetoresistance element. For example, BJT 130 and op-amp 120 may sense the current through magnetoresistance element 108 and, in response, drive BJT 130 to provide a constant voltage at node 132. Similarly, BJT 135 and op-amp 134 may monitor the current through magnetoresistance element 110 and generate a constant voltage at node 136, and BJT 137 and op-amp 134 may monitor the current through magnetoresistance element 112 and provide a constant voltage at node 138. Voltage reference 140 and current reference 142 may provide a reference voltage at the positive input terminal of op-amp 134.

In embodiments, BJTs 118 and 130 may be PNP BJTs. Their emitter terminals may be coupled to magnetoresistance element 106 and 108, respectively, and their collector terminals may be coupled to nodes 114 and 116, respectively. BJTs 135 and 138 may be NPN BJTs. Their emitter terminals may be coupled to magnetoresistance elements 110 and 112, respectively, and their collector terminals may be coupled to nodes 114 and 116, respectively. In other embodiments, BJTs 118, 130, 135, and 138 may be replaced by other types of transistors, or by any circuit that can act as an adjustable current source. Because magnetoresistance elements 106, 108, 110, and 112 may act as variable resistors, a controllable current source may be used to control the voltage across the magnetoresistance elements.

Figure 2:
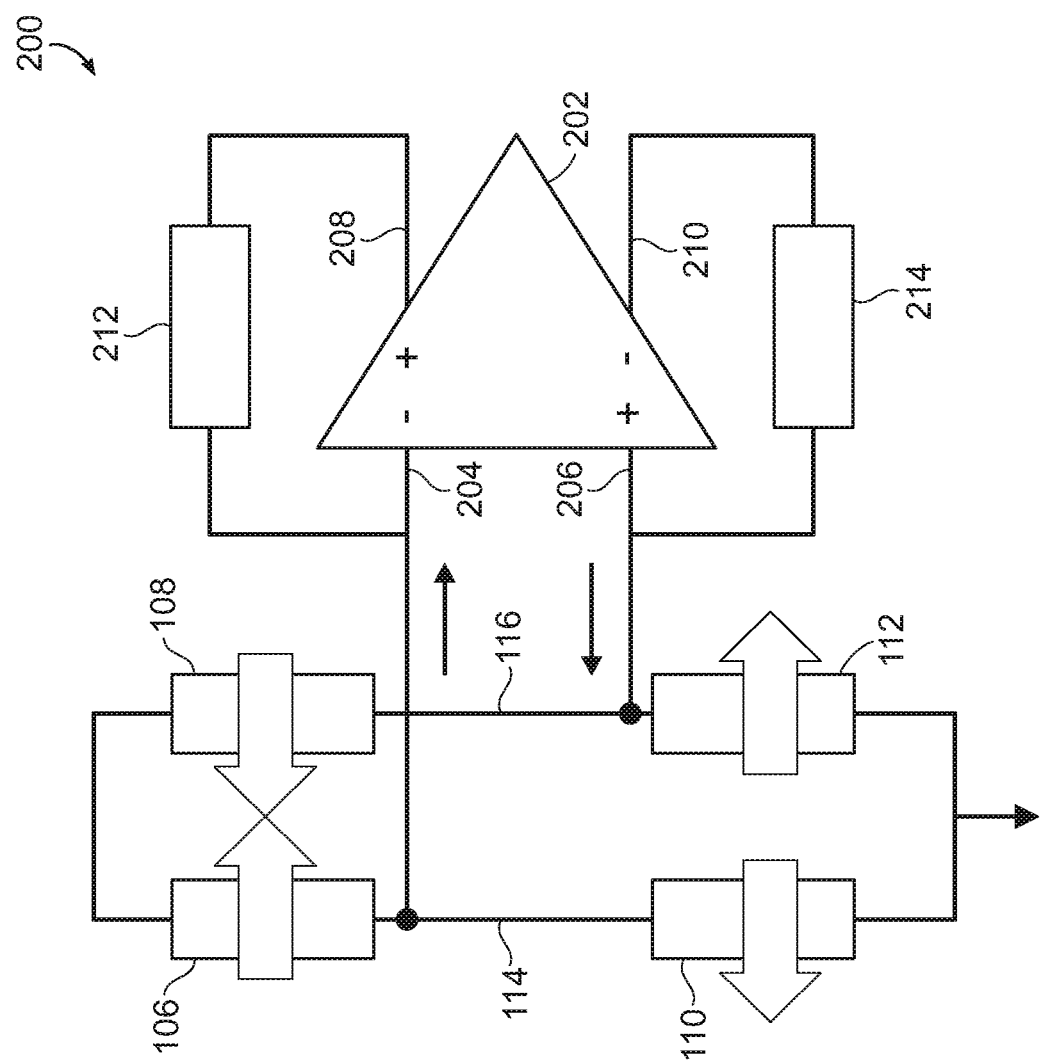
FIG. 2 is a circuit diagram of another embodiment of a magnetic field sensor.

Referring to FIG. 2, magnetic field sensor circuit 200 may include one or more magnetoresistance elements 106-112 configured in a bridge configuration, as described above. In an embodiment, circuit 200 includes a circuit to monitor the current through magnetoresistance elements 106-112 and provide a constant voltage across the magnetoresistance elements. This may reduce or eliminate any error caused by the magnetoresistance elements' conductance changing as a result of changes in voltage across the magnetoresistance elements.

In embodiments, differential amplifier 202 monitors the current through magnetoresistance elements 106-112 and forces the same voltage on nodes 114 and 116 such that the differential voltage out of the bridge is zero. If the positive and negative supply voltages for the bridge are constant, then this arrangement guarantees a constant voltage across the MR elements. Differential amplifier may receive a differential voltage input at its input terminals 204 and 206 and produce a differential output at its output terminals 208 and 210. Differential input terminals 204 and 206 may be coupled to output nodes 114 and 116 (respectively) of the magnetoresistance element bridge circuit. Positive output terminal 208 may be coupled to feedback resistor 212, which is fed back to input terminal 204. Negative output terminal 210 may be coupled to feedback resistor 214, which is fed back to input terminal 206.

Differential amplifier 202 (which may be an op-amp) may keep the voltage at nodes 114 and 116 constant. Differential current coming out of nodes 114 and 116 may flow through feedback resistors 212 and 214 (respectively), which may generate an output voltage at terminals 208 and 210.

Figure 3:
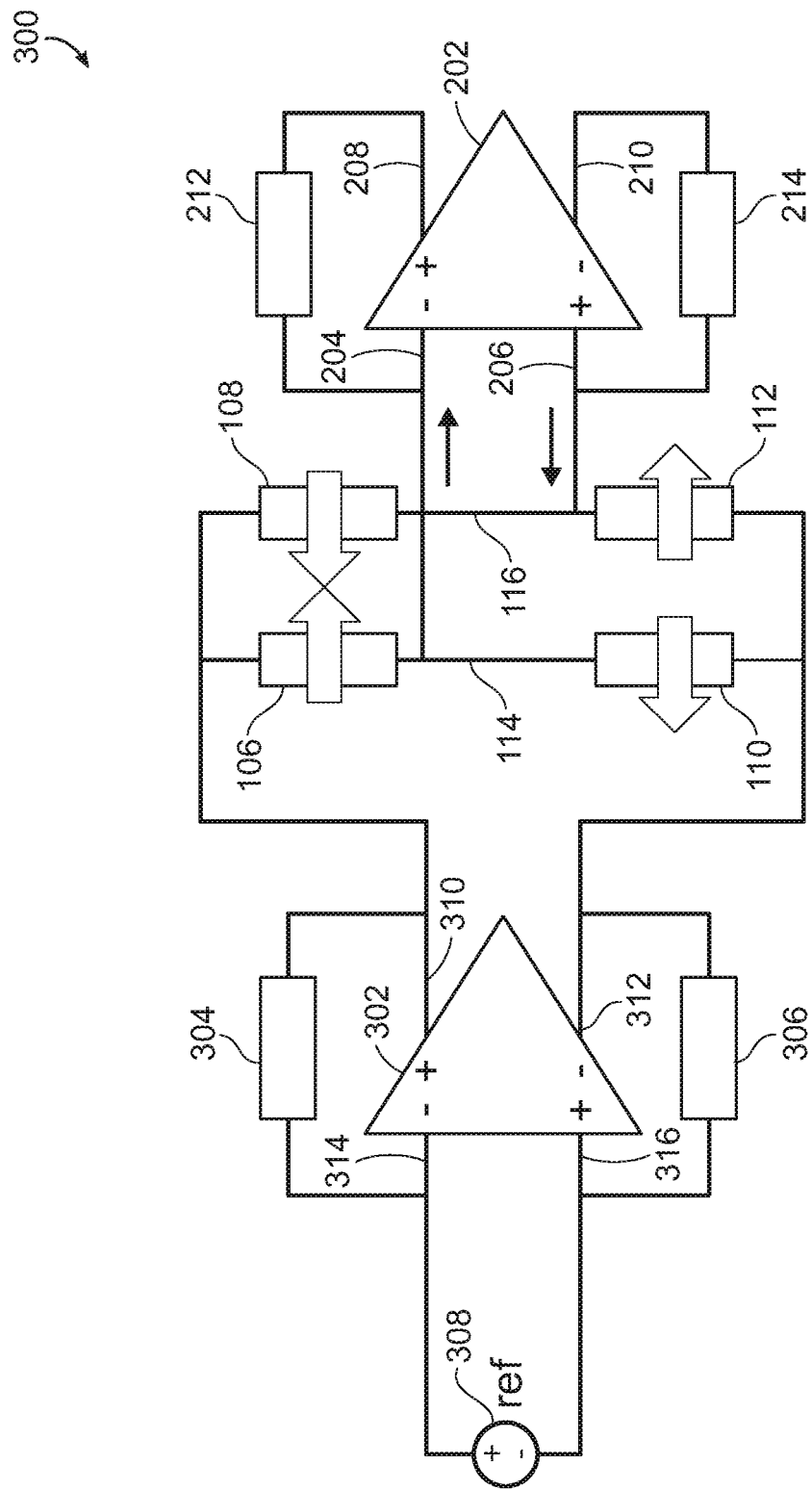
FIG. 3 is a circuit diagram of another embodiment of a magnetic field sensor.

Referring to FIG. 3, magnetic field sensor circuit may include one or more magnetoresistance elements 106-112 configured in a bridge configuration, as described above. In an embodiment, circuit 300 includes a circuit to monitor the current through magnetoresistance elements 106-112 and provide a constant voltage across the magnetoresistance elements. This may reduce or eliminate any error caused by changes in the magnetoresistance elements' conductance caused by changes in the voltage across the magnetoresistance elements.

In embodiments, differential amplifier 202 monitors the current through magnetoresistance elements 106-112 forces the same voltage on nodes 114 and 116 such that the differential voltage out of the bridge is zero. If the positive and negative supply voltages for the bridge are constant, then this arrangement guarantees a constant voltage across the MR elements. Differential amplifier may receive a differential voltage input at its input terminals 204 and 206 and produce a differential output at its output terminals 208 and 210. Differential input terminals 204 and 206 may be coupled to output nodes 114 and 116 (respectively) of the magnetoresistance element bridge circuit. Positive output terminal 208 may be coupled to feedback resistor 212, which is fed back to input terminal 204. Negative output terminal 210 may be coupled to feedback resistor 214, which is fed back to input terminal 206.

Circuit 300 may also include differential amplifier 302 having a positive output terminal 310 coupled to a high (e.g. power) side of the bridge of magnetoresistance elements 106-112, and a negative output terminal 312 coupled to the low (e.g. ground) side of the bridge of magnetoresistance elements 106-112. The input terminals of differential amplifier may be coupled to a reference voltage source 308. Feedback resistor 304 may be coupled between positive output terminal 310 and negative input terminal 314, and feedback resistor 306 may be coupled between negative output terminal 312 and positive input terminal 316.

Output terminal 310 and output terminal 312 may provide virtual power and ground (respectively) to the bridge circuit. Using differential amplifier 302 with feedback resistors 304 and 306 to provide virtual power and ground to the bridge circuit may increase the stability of the voltage across magnetoresistance elements 106-112, especially in the presence of an otherwise noisy power environment. This may reduce the occurrence of errors or inaccuracies caused by changes in voltage across the magnetoresistance elements, as described above (e.g. see formula 4).

Figure 4:
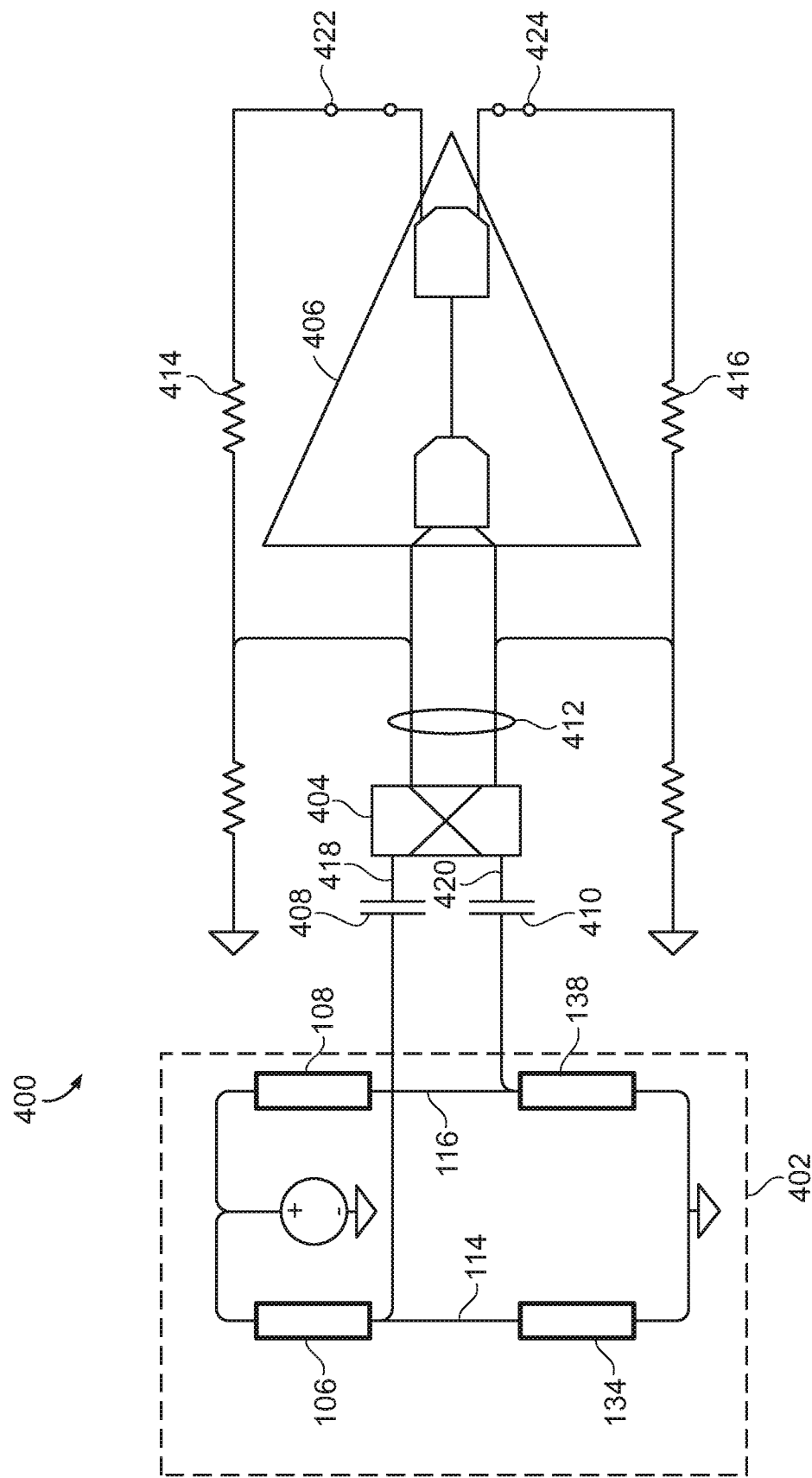
FIG. 4 is a circuit diagram of another embodiment of a magnetic field sensor.

Referring to FIG. 4, magnetic field sensor circuit 400 having a bridge circuit 402 (comprising magnetoresistance elements 106-112) that is AC coupled to differential amplifier 406. Magnetic field sensor circuit 400 may include series capacitor 408 coupled between node 114 and demodulator 404, and series capacitor 410 coupled between node 116 and demodulator 404. Series capacitors 408 and 410 may block any DC voltage component of the output signals of bridge circuit 402 prior to the signals reaching demodulator 404. In embodiments, demodulator 404 may be a rectifier circuit and/or a so-called chopper circuit.

Demodulated 412 (or chopped) signal 412 from demodulator 404 may be received by differential amplifier 406. Feedback resistors 414 and 416 may be coupled from the outputs to the inputs of differential amplifier 406, like feedback resistors 212 and 214 described above (see FIG. 2).

Magnetic field sensor circuit 400 may include a circuit to monitor the current through magnetoresistance elements 106-112. For example, series capacitors 408 and 410 may receive current signals from nodes 114 and 116 and translate the current signals into voltage signals 418 and 420 (respectively). As current flows into and out of capacitors 408 and 410, the charge on (and thus the voltage across) capacitors 408 and 410 changes, creating voltage signals 418 and 420. Voltage signals 418 and 420 may be rectified by demodulator 404. Differential amplifier 406 may then receive demodulated signal 412 to produce output signals 422 and 424 representing detection of the magnetic field by bridge circuit 402.

In this embodiment, the signal representing the detected field may be at a relatively high operating frequency and capacitors 408 and 410 may be chosen so that, at the operating frequency, they have negligible impedance. Thus, the differential voltage across nodes 114 and 116 the bridge at at high frequency will be close to zero and the voltage across all magnetoresistance elements 106, 108, 134, and 138 may be the same.

If operating frequencies are not high enough then the equivalent impedance of the capacitors might be comparable to the bridge resistances. In this case the voltage at nodes 114 and 116 may not exactly be the same. However, even under these conditions, any error produced by the voltage across the magnetoresistance elements may be smaller than if the bridge is interfaced with a standard voltage amplifier.

The AC coupling in circuit 400 may isolate sources of variation of conductivity of magnetoresistance elements 106, 108, 134, and 138 from signals representing the detected magnetic field. Thus, it may not be necessary to apply a constant voltage across magnetoresistance elements 106, 108, 134, and 138. For example, the voltage across magnetoresistance elements 106, 108, 134, and 138 may drift due to common mode voltage variations, temperature, or other factors. As long as the voltage drift has a relatively low frequency compared to the signal representing the detected magnetic field, then capacitors 408 and 410 will block the relatively low frequency variations and allow the higher frequency signal representing the detected field to pass through to demodulator 404. Non-linearity errors due to voltage variations across the magnetoresistance elements may be avoided since the variations associated with the magnetic field occur only at high frequency. In this respect, capacitors 408 and 410 may act as a high pass filter to allow signals representing to detected field to pass, while rejecting error signals caused by variations in conductivity of the magnetic field sensing elements.

This patent describes various example embodiments. However, the scope of the patent should not be limited to the described embodiments but rather should be limited only by the spirit and scope of the following claims. All references listed above are incorporated here by reference in their entirety.

The invention claimed is:

1. A magnetic field sensor comprising:
a magnetoresistance element with a variable conductivity that changes based on a function of a magnetic field strength and angle of an external magnetic field and a voltage across the magnetoresistance element; and
a circuit configured to monitor an electrical current through the magnetoresistance element during operation and to adjust a voltage at a terminal of the magnetoresistance element based on the monitored electrical current so that the voltage across the magnetoresistance element remains constant and the variable conductivity does not change as result of a changing voltage across the magnetoresistance element.

2. The magnetic field sensor of claim 1 where the circuit comprises a variable voltage source coupled in series with the magnetoresistance element.

3. The magnetic field sensor of claim 2 wherein the variable voltage source comprises a transistor.

4. The magnetic field sensor of claim 3 wherein the variable voltage source further comprises an operational amplifier having an output coupled to a base or gate terminal of the transistor.

5. The magnetic field sensor of claim 3 wherein the transistor is a bipolar junction transistor.

6. The magnetic field sensor of claim 1 further comprising a plurality of magnetoresistance elements arranged to form a bridge circuit, each having a variable conductivity that changes based on a function of the magnetic field strength and angle of the external magnetic field and a voltage across each of the plurality of magnetoresistance elements.

7. The magnetic field sensor of claim 6 wherein the circuit comprises a differential operational amplifier having a negative input coupled to a first output terminal of the bridge circuit and a positive input coupled to a second output terminal of the bridge circuit.

8. The magnetic field sensor of claim 6 wherein the circuit monitors an electrical current through each of the plurality of magnetoresistance elements.

9. The magnetic field sensor of claim 6 where the circuit comprises a plurality of variable voltage sources each coupled in series with one of the plurality of magnetoresistance elements.

10. The magnetic field sensor of claim 9 wherein each of the plurality of variable voltage sources comprises a transistor.

11. The magnetic field sensor of claim 10 wherein the transistor is a bipolar junction transistor.

12. The magnetic field sensor of claim 10 wherein the each of the plurality of variable voltage sources further comprises an operational amplifier having an output coupled to a base or gate terminal of a respective transistor.

13. The magnetic field sensor of claim 12 further comprising a first feedback loop coupled from a positive output terminal of the operational amplifier to a negative input terminal of the operation amplifier and a second feedback loop coupled from a negative output terminal of the operational amplifier to a positive input of the operational amplifier.

14. The magnetic field sensor of claim 13 wherein the first feedback loop comprises a first feedback resistor and the second feedback loop comprises a second feedback resistor.

15. The magnetic field sensor of claim 12 further comprising a second differential operational amplifier, wherein a positive output terminal and a negative terminal of the second differential amplifier are coupled to the bridge circuit.

16. The magnetic field sensor of claim 15 wherein the positive output terminal of the second differential amplifier is coupled to a power side of the bridge circuit and the negative terminal of the second differential amplifier is coupled to a ground side of the bridge circuit so that the second differential amplifier provides power to the bridge circuit.

17. The magnetic field sensor of claim 6 further comprising:
a first output terminal of the bridge circuit;
a second output terminal of the bridge circuit; and
a demodulator circuit;
wherein the first and second output terminals of the bridge circuit are coupled to the demodulator circuit.

18. The magnetic field sensor of claim 17 wherein the first and second output terminals of the bridge circuit are AC-coupled to the demodulator circuit.

19. The magnetic field sensor of claim 17 further comprising a differential operational amplifier, wherein an output of the demodulator circuit is coupled to an input terminal of the differential operational amplifier.

20. The magnetic field sensor of claim 17 wherein the demodulator circuit is a chopper circuit.

21. A magnetic field sensor comprising:
a magnetoresistance element with a variable conductivity that changes based on a function of a magnetic field strength and angle of an external magnetic field and a voltage across the magnetoresistance element; and
a circuit configured to reject error signals caused by variations in conductivity of the magnetoresistance element due to changes in voltage across the magnetoresistance element;
wherein the circuit provides AC coupling between the magnetoresistance element and a demodulator circuit.

22. The magnetic field sensor of claim 21 wherein the demodulator circuit is a chopper circuit.

23. A magnetic field sensor comprising:
a magnetoresistance element with a variable conductivity that changes based on a function of a magnetic field strength and angle of an external magnetic field and a voltage across the magnetoresistance element; and
a circuit configured to reject error signals caused by variations in conductivity of the magnetoresistance element due to changes in voltage across the magnetoresistance element;
wherein the circuit comprises a high-pass filter that allows signals representing a magnetic field detected by the magnetoresistance element to pass through the high-pass filter.

24. The magnetic field sensor of claim 23 wherein the circuit is coupled between the magnetoresistance element and a demodulator circuit, and wherein the demodulator circuit is a chopper circuit.

25. A magnetic field sensor comprising:
a magnetoresistance element with a variable conductivity that changes based on a function of a magnetic field strength and angle of an external magnetic field and a voltage across the magnetoresistance element; and
a circuit configured to reject error signals caused by variations in conductivity of the magnetoresistance element due to changes in voltage across the magnetoresistance element;
wherein the circuit comprises one or more capacitors connected in series to an output signal of the magnetoresistance element.

26. The magnetic field sensor of claim 25 wherein the circuit is coupled between the magnetoresistance element and a demodulator circuit, and wherein the demodulator circuit is a chopper circuit.

27. A magnetic field sensor comprising:
a magnetoresistance element with a variable conductivity that changes based on a function of a magnetic field strength and angle of an external magnetic field and a voltage across the magnetoresistance element; and
means for monitoring an electrical current through the magnetoresistance element and adjusting a voltage at a terminal of the magnetoresistance element based on the monitored electrical current so that the voltage across the magnetoresistance element remains constant and the variable conductivity does not change as a result of a changing voltage across the magnetoresistance element.

28. The magnetic field sensor of claim 27 wherein the electrical current monitoring means is coupled between the magnetoresistance element and a demodulator circuit, and wherein the demodulator circuit is a chopper circuit.

* * * * *

UNITED STATES PATENT AND TRADEMARK OFFICE
CERTIFICATE OF CORRECTION

Page 1 of 2

PATENT NO. : 10,794,936 B2
APPLICATION NO. : 16/139742
DATED : October 6, 2020
INVENTOR(S) : Hernán D. Romero It is certified that error appears in the above-identified patent and that said Letters Patent is hereby corrected as shown below:

In the Specification

Column 1, Line 33-34 delete "in output" and replace with --in an output--.

Column 1, Line 43 delete "elements may" and replace with --elements that may--.

Column 1, Line 45 delete "embedment," and replace with --embodiment,--.

Column 4, Line 2 delete "sensing, which" and replace with --sensing elements, which--.

Column 4, Line 28 delete "response the" and replace with --response to the--.

Column 4, Line 36 delete "of magnetoresistance" and replace with --of the magnetoresistance--.

Column 4, Line 54 delete "variable" and replace with --variables--.

Column 5, Line 50 delete "element" and replace with --elements--.

Column 6, Line 37 delete "106-112 forces" and replace with --106-112 and forces--.

Column 6, Line 57-58 delete "amplifier may" and replace with --amplifier 302 may--.

Column 7, Line 8 delete "that is" and replace with --is--.

Column 7, Line 17 delete "Demodulated 412 (or" and replace with --Demodulated (or--.

Column 7, Line 39 delete "the bridge at at high frequency".

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,794,936 B2

Column 8, Line 1 delete "representing to detected fields" and replace with --representing detected fields--.

In the Claims

Column 8, Line 24 Claim 1 delete "as result" and replace with --as a result--.

Column 8, Line 26 Claim 2 delete "where" and replace with --wherein--.

Column 8, Line 44-45 Claim 7 delete "negative input" and replace with --negative input terminal--.

Column 8, Line 46 Claim 7 delete "positive input" and replace with --positive input terminal--.

Column 8, Line 51 Claim 8 delete "where" and replace with --wherein--.

Column 9, Line 2 Claim 13 delete "positive input" and replace with --positive input terminal--.

Column 9, Line 9 Claim 15 delete "negative terminal" and replace with --negative output terminal--.

Column 9, Line 15 Claim 16 delete "negative terminal" and replace with --negative output terminal--.

Column 9, Line 30-31 Claim 19 delete "output of" and replace with --output terminal of--.